(12) United States Patent
Dunn

(10) Patent No.: US 8,004,648 B2
(45) Date of Patent: Aug. 23, 2011

(54) AIR CURTAIN FOR DISPLAY

(75) Inventor: William R. Dunn, Alpharetta, GA (US)

(73) Assignee: Manufacturing Resources International, Inc., Alpharetta, GA (US)

( * ) Notice: Subject to any disclaimer, the term of this patent is extended or adjusted under 35 U.S.C. 154(b) by 822 days.

(21) Appl. No.: 11/941,728

(22) Filed: Nov. 16, 2007

(65) Prior Publication Data

US 2009/0128729 A1 May 21, 2009

(51) Int. Cl.
*G02F 1/1333* (2006.01)

(52) U.S. Cl. .......................................... 349/161; 349/58

(58) Field of Classification Search .................... 349/58, 349/161; 165/104.31; 361/679.46–679.51, 361/679.5, 690, 694, 695, 699; 40/448; 62/255, 62/256
See application file for complete search history.

(56) References Cited

U.S. PATENT DOCUMENTS

| | | | |
|---|---|---|---|
| 5,432,526 A * | 7/1995 | Hyatt .............................. | 345/87 |
| 6,493,440 B2 * | 12/2002 | Gromatzky et al. .......... | 379/161 |
| 6,891,135 B2 | 5/2005 | Pala et al. | |
| 7,018,054 B2 * | 3/2006 | Miyashita et al. ............ | 353/119 |
| 7,190,587 B2 | 3/2007 | Kim et al. | |
| 7,354,159 B2 * | 4/2008 | Nakamura et al. ............. | 353/85 |
| 2004/0239823 A1 * | 12/2004 | Silsby et al. .................... | 349/40 |
| 2008/0099193 A1 * | 5/2008 | Aksamit et al. ............... | 165/300 |

FOREIGN PATENT DOCUMENTS

KR 1020070070675 * 7/2007

* cited by examiner

Primary Examiner — Dung Nguyen
Assistant Examiner — Tai Duong
(74) Attorney, Agent, or Firm — Standley Law Group LLP

(57) ABSTRACT

A system and method for providing an air curtain over the screen of an LCD display. Air intakes are located in the housing of the LCD display, and air is pulled into the cavity of the display by one or more fans located in the housing. Air flows through the cavity and exits through a series of air baffles located along the top of the LCD display screen. The air baffles direct the air along the surface of the LCD display, creating an air curtain that may cool the LCD display. The flow of air through the display cavity may also cool the internal components of the LCD display.

20 Claims, 5 Drawing Sheets

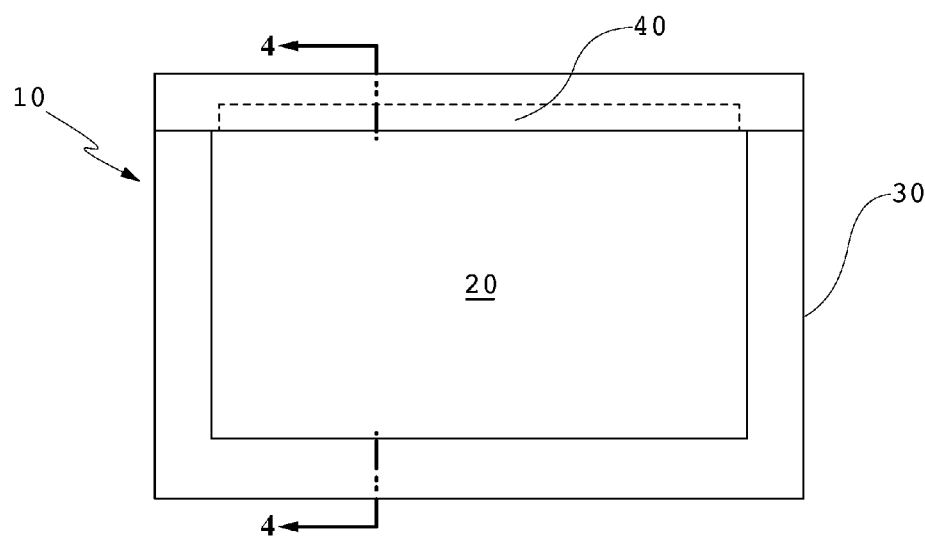
FIG-1
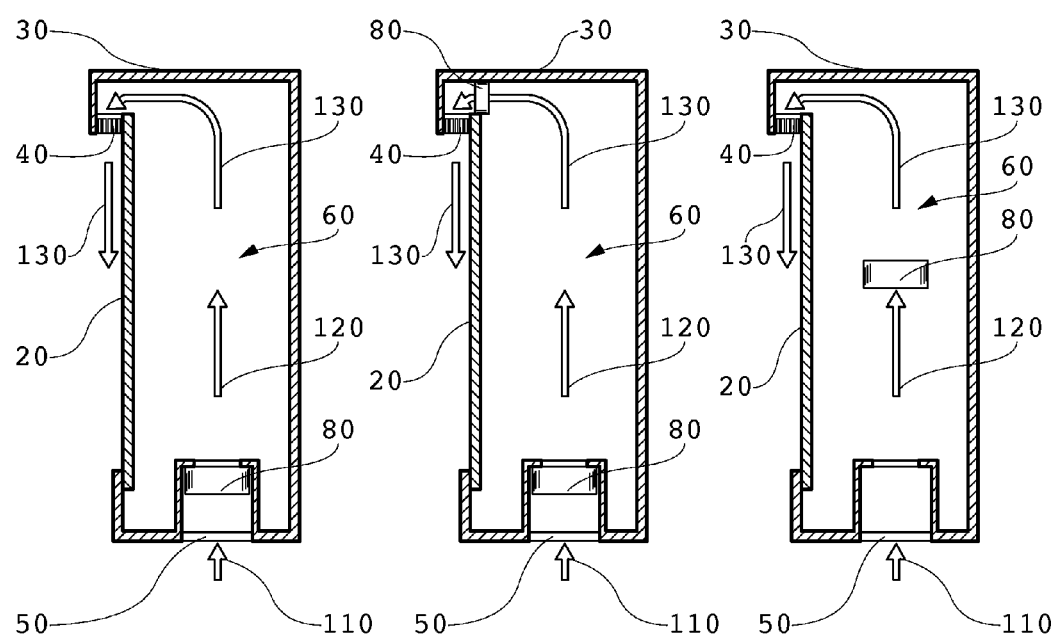
FIG-4A  FIG-4B  FIG-4C

AIR CURTAIN FOR DISPLAY

CROSS-REFERENCE TO RELATED APPLICATIONS

This application makes no priority claim.

TECHNICAL FIELD

The disclosed embodiments of the present invention relate to a method and system for reducing the internal temperature of a display and, particularly, for reducing the temperature of the glass in the display. More particularly, the present invention relates to a system and method of circulating air through the cavity of a Liquid Crystal Display (LCD) device and over the surface of the LCD in order to reduce the internal temperature of the device and the surface temperature of the LCD.

BACKGROUND AND SUMMARY OF THE INVENTION

In order for Liquid Crystal Displays (LCDs) to display an image they must be illuminated by a light source, commonly referred to as a "backlighting." Backlighting can be provided by a variety of different sources, such as Light Emitting Diodes (LEDs), incandescent light bulbs, an electroluminescent panel (ELP), cold cathode florescent lamps (CCFLs) or hot cathode florescent lamps (HCFLs). LEDs are a common choice for backlighting of LCDs because they generate a high amount of light. However, it is commonly known that LEDs also generate a considerable amount of heat. When used in LCD displays the amount of heat can be troublesome, attributing to malfunctioning of the LCD, and a shortened LCD lifetime. Furthermore, as the demand for bigger LCDs and better quality increases, the problem of heat generation increases as well.

The problem of heat generation in LCD displays is further exacerbated when an LCD display is used in high temperature setting. LCD displays used in outdoor settings are often exposed to sunlight and high outdoor temperatures that can cause malfunctioning of the LCD display due to excessive heat. In many parts of the United States summer temperatures reach over 100 degrees Fahrenheit. LCD displays in these types of environments can malfunction and have shorter lives due to such extreme heat. An example of an outdoor setting in which an LCD display may be exposed to high temperatures is at a car wash. For LCD displays located on or near parking lots, not only could the LCD displays be in direct sunlight, but may also be impacted by heat rising up from the pavement, However, LCD display malfunctioning due to high heat isn't just an outdoor concern. High indoor temperatures often occurring in industrial settings may also attribute to the malfunctioning of LCD displays.

It is therefore an unmet advantage of the prior art to provide effective cooling for LCD displays. This and other unmet advantages are provided by the system and method described and shown in more detail below.

BRIEF DESCRIPTION OF THE DRAWINGS

A better understanding of the disclosed embodiments will be obtained from a reading of the following detailed description and the accompanying drawings wherein identical reference characters refer to identical parts and in which:

FIG. 1 is a front elevational view of an exemplary embodiment of an LCD display of the present invention.

FIGS. 4A-4C are right side cross-sectional views of various embodiments of the display assembly as indicated by line 4-4 in FIG. 1.

FIG. 5b is a bottom perspective view of the second exemplary embodiment shown in FIG. 5a.

FIG. 6 is a right-side cross-sectional view of the second exemplary embodiment shown in FIGS. 5a and 5b as taken along line 6-6 in FIG. 5a.

DETAILED DESCRIPTION OF EXEMPLARY EMBODIMENTS

Exemplary embodiments are directed to a system and method for providing air circulation through the cavity of a display, such as a television display. In particular, the system and method provides an air curtain over the display surface which may reduce the temperature of the display surface. Air circulation through the cavity of the LCD device may also reduce the temperature of the internal components of a display device. The system and method of the present invention may be used on any type of display device, including LCD, plasma, or rear-projection displays. Based on the present description, it should be recognized that the system and method of the present invention may also be used to circulate air through and over the viewing screen of any type of display device, and that circulation may be performed to regulate the temperature of the display device as desired.

Figure 2:
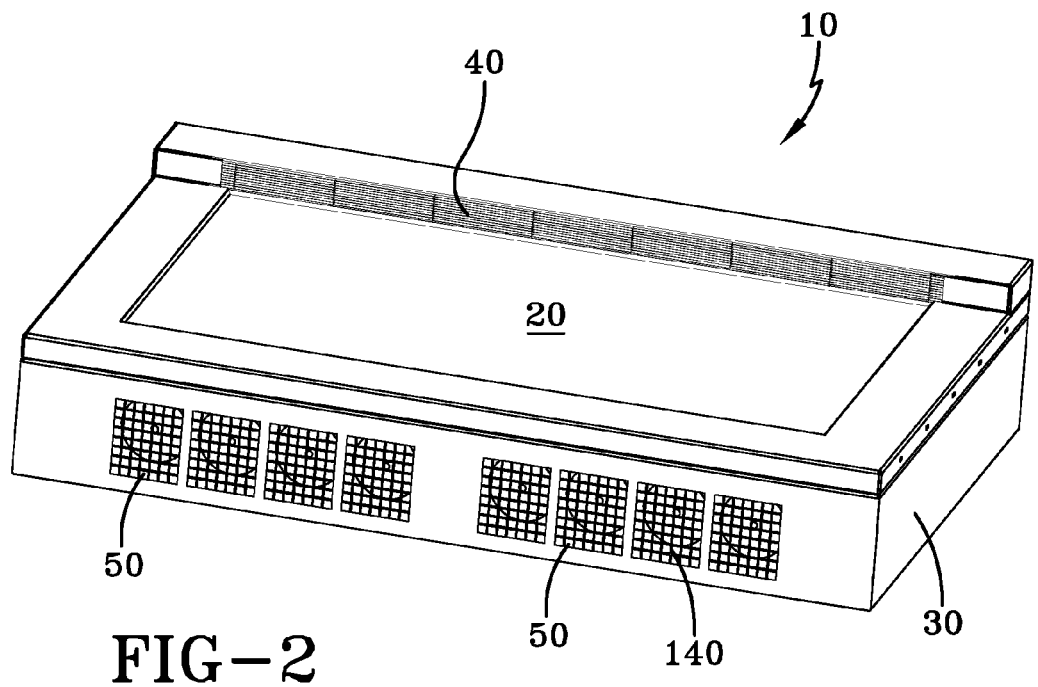
FIG. 2 is a bottom perspective view of the exemplary embodiment of the LCD display shown in FIG. 1.

An exemplary embodiment of an LCD display 10 of the present invention is shown in FIGS. 1 and 2. As shown, an LCD display panel 20 having a typical rectangular shape may be contained within a housing 30 having a box-like shape that accommodates the components of the LCD display 10. The LCD display panel 20 may be comprised of all layers necessary for an operational LCD display panel 20, which may include the LCD layer, the front substrate layer, and the back substrate layer. However, in other embodiments different types of layers may be included.

As shown in FIG. 2, the portion of the housing 30 located on the front of the LCD display 10 and above the display panel 20 may extend out over the display panel 20 while the rest of the housing 30 on the front of the LCD display 10 remains relatively flush to the display panel 20. As shown in FIG. 2, air baffles 40 may be located along the bottom surface of the extended section of housing 30. The air baffles 40 may be located along the entire length of the top of the LCD display 10.

The bottom of the housing 30 may contain multiple air intakes 50 located along its length. As shown in FIG. 2, the air intakes 50 may be of similar rectangular shape, and may be arranged in two series of four equally-spaced holes in the bottom surface of the housing 30. However, in other embodiments the air intakes 50 may have different shapes, may vary in number, or may be in different arrangements along different surfaces of the housing 30. For example, in at least one exemplary embodiment there may only be one long rectangular air intake 50 that extends along the length of the bottom of the housing 30. In yet other embodiments of the present invention the air intake 50 may be located in positions other than the bottom of the housing 30.

Figure 3:
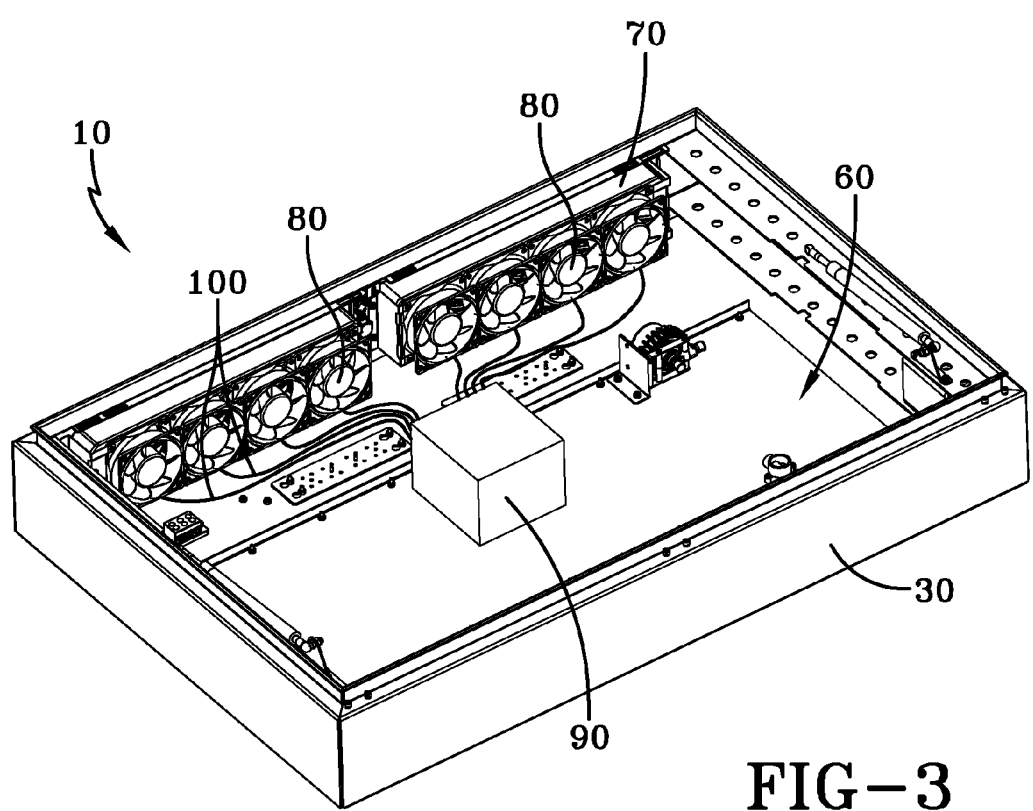
FIG. 3 is a rear perspective view of the exemplary embodiment of the LCD display in FIG. 1, where the front face of the LCD display has been omitted.

As shown in FIG. 3, where the front of the LCD display 10 has been omitted to show the internal components and the cavity 60 of the LCD display 10, located along the interior of the bottom of the housing 30 may be a fan mount 70 holding multiple fans 80. The fan mount 70 may be positioned adjacent to the air intake 50 and the fans 80 held by the fan mount 70 may be positioned such when operating they pull air from the outside environment into the cavity 60 of the LCD display 10. As can be seen in FIG. 3, in some embodiments of the present invention there may be one fan 80 for each air intake 50. However, in other embodiments there may be fewer fans 80 than air intakes 50, or in other cases, such as where there is only one air intake 50, there may be multiple fans 80 per air intake 50. Similarly, while the embodiment shown in FIG. 6 contains eight fans 80, in other embodiments of the present invention there may be only one fan 80, or any number of multiple fans 80. Also, while the fan mount 70 shown in FIG. 1 runs along the length of the bottom of the housing 30, depending on how many fans 80 are used and how long and wide the bottom of the housing 30 is, the configuration of the fan mount 70 may vary accordingly.

Each fan 80 may receive power from a power source 90 through power lines 100 extending from the fans 80 to the power source 90 contained within the housing 30. The power source 90 may be connected to the main power source for the LCD display 10. In other embodiments of the present invention each fan 80 derives power directly from the main power source for the LCD display 10.

FIG. 4A shows the circulation of air through an exemplary embodiment of a LCD display 10 of the present invention that may occur when the fans 80 are operated. As shown, the fans 80 may pull air from the environment surrounding the housing 30 through the air intakes 50. This flow of air is shown by air flow arrow 110. The air coming into the housing 30 through the air intakes 50 may flow from the bottom of the cavity 60 of the LCD display 10 to the top of the cavity 60 where it then enters the air baffles 40. This flow is illustrated by air flow arrows 120. The air baffles 40 may contain an array of air passages directed along the plane of the LCD display panel 20. As the air flows from the cavity 60 through the air baffles 40 and out into the environment surrounding the housing 30, the air baffles 40 may direct the air across the entire surface of the LCD display panel 20. This flow of air across the LCD display panel 20 is shown by flow arrows 130. In some embodiments of the present invention the air flow through the cavity 60 as well as over the surface of the LCD display panel 20 will be an almost laminar flow.

As air is circulated through the cavity 60 of the LCD display 10 and over the LCD display panel 20, it may cool both the cavity 60 and the LCD display panel 20 through convection.

Figure 5A:
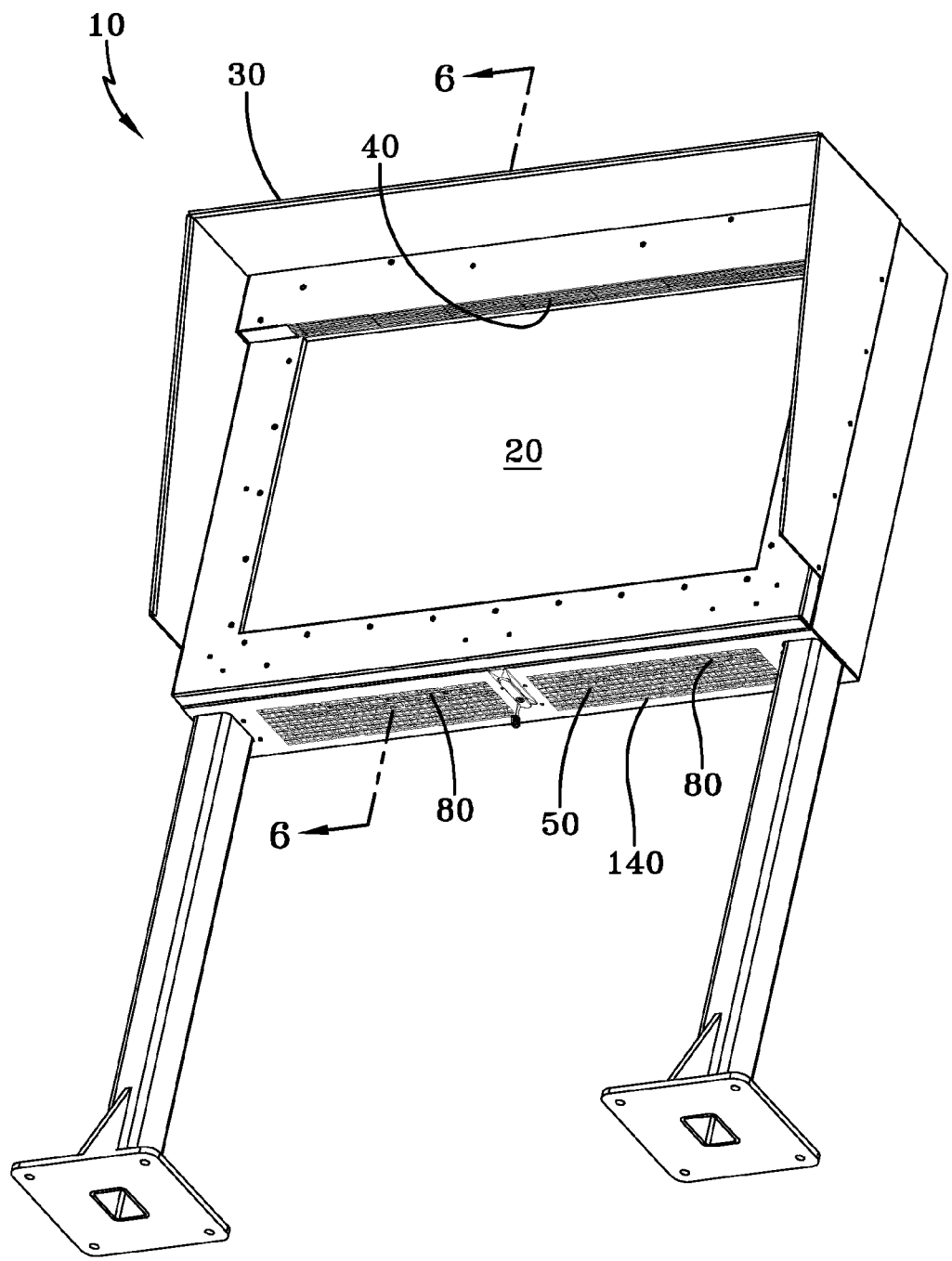
FIG. 5a is a front perspective view of a second exemplary embodiment of an LCD display of the present invention.
Figure 5B:
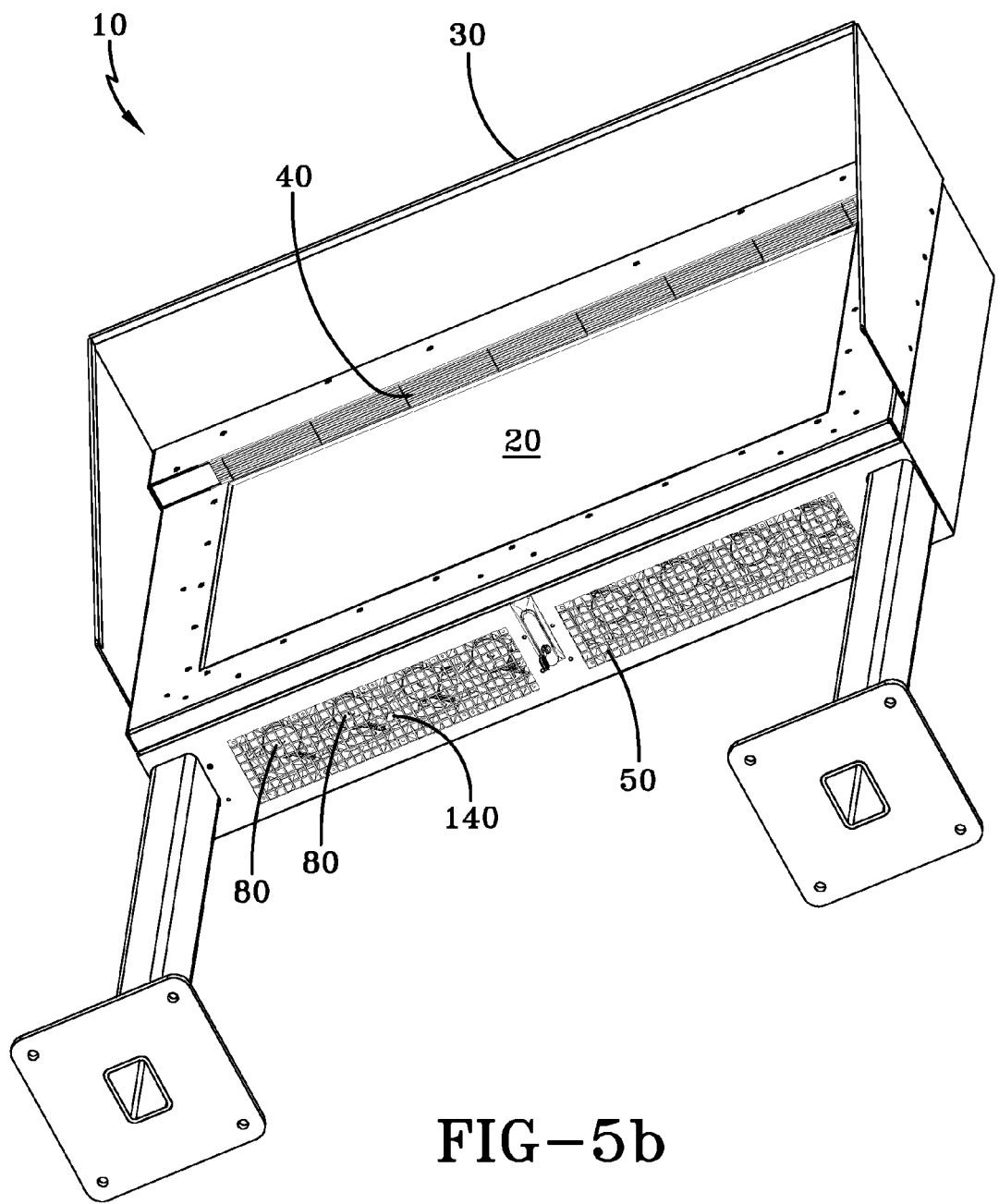
Figure 6:
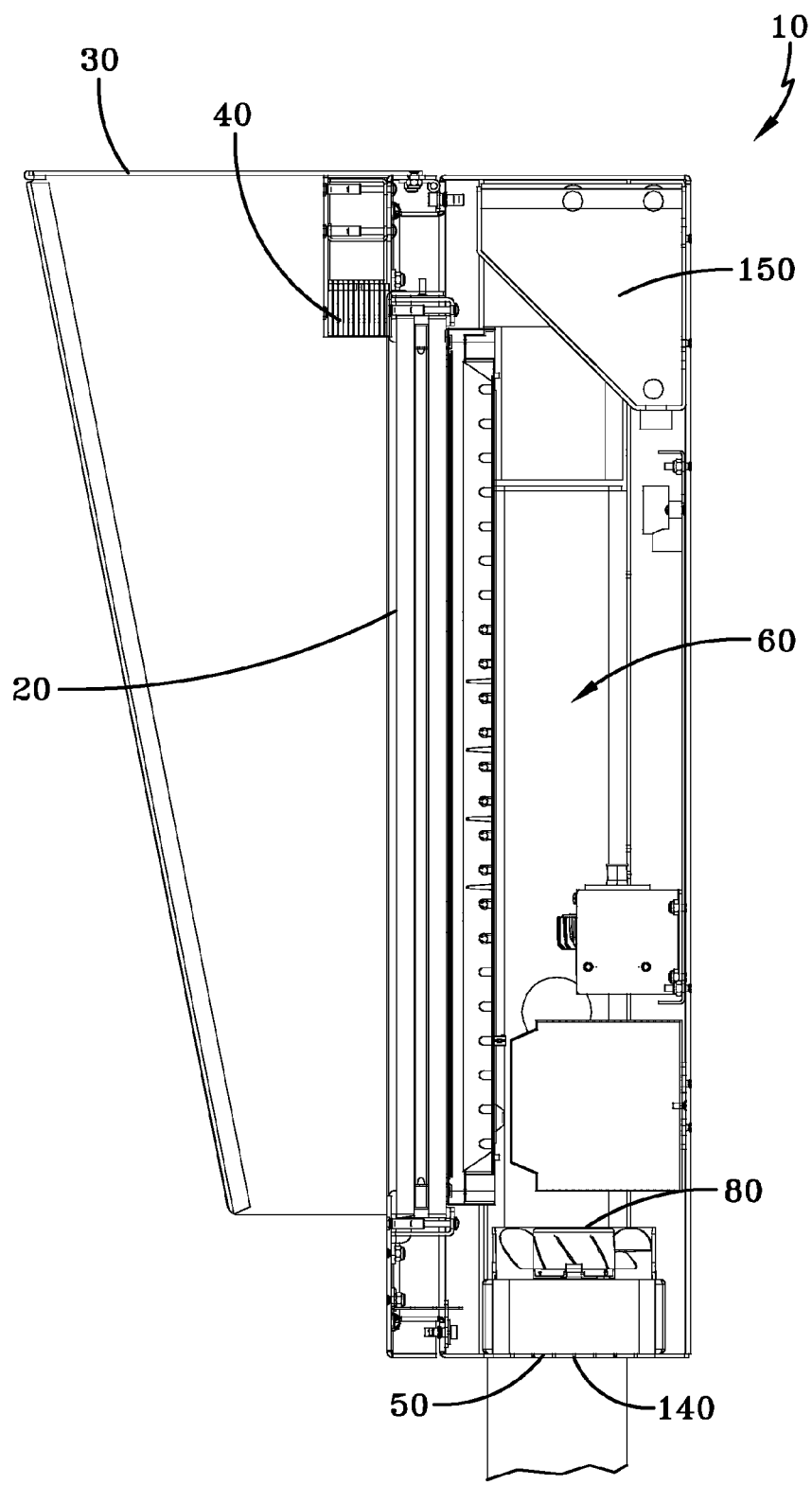

FIGS. 5a and 5b shows different views of an exemplary embodiment of an LCD display 10 of the present invention. FIG. 6 shows a cross-sectional view of this embodiment taken along line 6-6 in FIG. 5a. As shown in this embodiment, a portion of the housing 30 may extend out over and around the LCD display panel 20 in order to shield the LCD display panel 20 and prevent glare, fade-out caused by sunlight, or otherwise make it easier for viewers to see the LCD display panel 20. As shown in FIG. 5b, in this embodiment there are two air intakes 50, each providing air intake for four fans 80. FIG. 6 shows the relative locations and positions of an air intake 50, fan 80, fan mount 70, cavity 60, air baffles 40, and LCD display panel 20. As shown in FIG. 5b, there may be two large air intakes 50 that provide air flow to four fans 80 each.

As shown in FIG. 5b, the air intakes 40 may be covered with a screen 140 in order to prevent dust and debris from entering the LCD cavity 60. In other embodiments of the present invention the air intakes 40 may have another type of covering that acts to prevent the intake of dust and debris into the cavity 60.

As shown in FIG. 6, in some embodiments of the present invention there may be an air director 150 positioned within the housing 30 to direct the air flowing through the cavity 60 in the direction of the air baffles 40. The air director 150 may be angled across the top rear corner of the cavity 60 such that when air flowing through the cavity 60 hits the air director 150 it is directed in the direction of the air baffles 40. The air director 150 may be made from metal, plastic, or any other material with a non-perforated surface.

While in FIG. 6 the air intakes 50 and fans 80 are located on the bottom of the LCD display panel 20 and the air baffles 40 are located at the top, in other embodiments of the present invention the air intakes 50 and fans 80 may be at the top of the LCD display panel 20 and the air baffles 40 may be located at the bottom, causing air to circulate through the cavity 60 and over the LCD display panel 20 in a direction opposition to that shown in FIG. 4. In other embodiments of the present invention the air intakes 50, fans 80, and air baffles 40 may be located in any other relative locations that allow for air to be circulated within the cavity 60 and over the LCD display panel 20.

As shown in FIGS. 4B-4C, in some embodiments of the present invention fans 80 may not only be located near the air intakes 50, but there may also be additional fans 80 located within the cavity 60 in order to promote the circulation of air through the cavity 60. For example, in large LCD displays additional fans 80 may be located within the mid- to upper part of the cavity 60 to help pull air up through the cavity 60 and push it out through the air baffles 40. This addition of fans 80 may increase the volume of air that flows through the cavity 60, thereby increasing the cooling effect. The volume of air circulating through the cavity 60 may also be controlled by the size and power of the fans 80.

In some embodiments the fans 80 will be powered at all times, providing a constant flow of air through the cavity 60 and over the LCD display panel 20 regardless of the temperature of the surrounding environment. However, in other embodiments of the present invention power to the fans 80 will be dictated by a thermal sensor associated with the power source 90. In these embodiments the fans 80 will only receive power when the thermal sensor recognizes that either the environmental temperature, internal temperature, or screen temperature is above a pre-determined limit. In these embodiments the fans 80 will only be turned on when one or more of these temperatures are above this pre-determined limit.

In some embodiments of the present invention the air curtain system described herein may be the only means utilized for regulating the temperature of an LCD display 10. However, in other embodiments of the present invention the air curtain system may be used in conjunction with other systems for keeping the LCD display 10 cool. For example, the air curtain system of the present invention may be used in conjunction with a water cooling system.

Other embodiments of the present invention may include means within the cavity 60 for refrigerating the air. In these embodiments the air that is passed over the LCD display panels 20 by the air baffles 40 may be cooler than that of the surrounding environment.

The air curtain system and method of the present invention may be used on LCD displays 10 of any size, and in any setting where it is desirable to regulate the temperature of an LCD display 10. The exemplary embodiment shown in FIGS. 5a, 5b, and 6 may also be used at gas stations, automatic car washes, or in other outdoor or indoor settings where a LCD display will be subject to warm temperatures. For all embodiments, the size of the air intakes 50, fans 80 and air baffles 40 may be sized accordingly to provide air circulation through any sized LCD display 10.

Some embodiments of the present invention may involve displays other than LCD displays. An example would be a plasma display or rear-projection television. An exemplary embodiment may be used with any type of display where it is desirable to regulate the temperature both of the screen and inside the device.

Having shown and described exemplary embodiments of the invention, those skilled in the art will realize that many variations and modifications may be made to affect the described invention and still be within the scope of the claimed invention. Thus, many of the elements indicated above may be altered or replaced by different elements which will provide the same result and fall within the spirit of the claimed invention. It is the intention, therefore, to limit the invention only as indicated by the scope of the claims.

What is claimed is:

1. A system for cooling a display, comprising:
a housing;
a display within said housing, the display having an exterior viewable surface;
an air intake within said housing;
an air baffle extending out from the exterior viewable surface of the display which accepts air from said intake and directs it on to the exterior viewable surface of the display;
a fan located within said housing which pulls air through said intake and pushes air through said air baffle; and
a power source for powering said fan.

2. The system of claim 1 wherein said fan is located adjacent to said air intake.

3. The system of claim 1 wherein said display is a liquid crystal display.

4. The system of claim 1 wherein said power source sends power to the fan in response to thermal data.

5. The system of claim 1 wherein:
the air baffle is above the exterior viewable surface of the display.

6. The system of claim 1 wherein:
the air baffle is located along the entire length of the top of the display.

7. The system of claim 1 further comprising:
a screen placed adjacent to the air intake.

8. A system for cooling a display, comprising:
a housing;
an air intake located on said housing;
a liquid crystal display (LCD) within said housing and having an exterior viewable surface;
a cavity behind the LCD;
an air baffle in gaseous communication with the cavity, said baffle directs air from said cavity over the exterior viewable surface of said display; and
a fan positioned to draw air through the air intake, push air through the cavity, and push air through the baffle.

9. The system of claim 8 wherein said air intake is located on a bottom surface of said housing.

10. The system of claim 9 wherein said fan is located adjacent to said air intake.

11. The system of claim 8 further comprising:
an air director within the cavity which directs air into the air baffle.

12. The system of claim 8 further comprising:
a second fan placed within the cavity which draws air through the cavity and into the air baffle.

13. The system of claim 8 further comprising:
a means for filtering the air being drawn through the air intake.

14. A system for displaying information in an outdoor environment comprising:
a display housing mounted in an outdoor environment;
a liquid crystal display (LCD) within the display housing, the LCD having an exterior viewable surface;
an air intake located on the display housing;
an extended portion of the display housing located above the exterior viewable surface of the LCD which extends out from the LCD, the portion having a bottom surface;
an air baffle located on the bottom surface of the extended portion of the display housing;
a first fan positioned to draw air into the air intake; and
a second fan positioned to draw air through the display housing and push air through the air baffle.

15. The display system of claim 14 wherein:
the outdoor environment is a bus stop.

16. The display system of claim 14 wherein:
the outdoor environment is the side of a building.

17. The display system of claim 14 wherein:
the outdoor environment is a parking lot.

18. The display system of claim 14 wherein:
the outdoor environment is a car wash.

19. The system of claim 14 wherein:
the air baffle is located along the entire length of the LCD.

20. The system of claim 14 further comprising:
a screen placed adjacent to the air intake.

* * * * *